United States Patent
Oughton, Jr. et al.

(10) Patent No.: US 8,593,209 B2
(45) Date of Patent: Nov. 26, 2013

(54) RESONANT TANK DRIVE CIRCUITS FOR CURRENT-CONTROLLED SEMICONDUCTOR DEVICES

(75) Inventors: George W. Oughton, Jr., Raleigh, NC (US); Anthony Olivo, Raleigh, NC (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 12/968,861

(22) Filed: Dec. 15, 2010

(65) Prior Publication Data

US 2012/0153995 A1 Jun. 21, 2012

(51) Int. Cl.
*H03K 17/687* (2006.01)
(52) U.S. Cl.
USPC ............ 327/427; 327/108; 327/112; 327/428
(58) Field of Classification Search
USPC ......... 327/108–112, 379, 389, 391, 415, 416, 327/427–476; 326/22–27, 81–87
See application file for complete search history.

(56) References Cited

U.S. PATENT DOCUMENTS

| | | | | |
|---|---|---|---|---|
| 3,936,721 | A * | 2/1976 | Butterworth | 327/540 |
| 4,395,647 | A | 7/1983 | Morong, III | |
| 6,172,550 | B1 * | 1/2001 | Gold et al. | 327/366 |
| 6,344,768 | B1 * | 2/2002 | Daun-Lindberg et al. | 327/424 |
| 2003/0164721 | A1 * | 9/2003 | Reichard | 327/108 |
| 2004/0196077 | A1 * | 10/2004 | Wilhelm | 327/112 |
| 2004/0227547 | A1 * | 11/2004 | Shiraishi et al. | 327/110 |
| 2008/0054986 | A1 * | 3/2008 | Berkebile | 327/447 |
| 2010/0188134 | A1 * | 7/2010 | Pidutti et al. | 327/427 |

FOREIGN PATENT DOCUMENTS

WO  WO 02/052704 A2  7/2002

OTHER PUBLICATIONS

Wu et al., *Multi-Channel Constant Current LLC Resonant LED Driver*, CPES Conference (2011), pp. 1-8.
Wu et al., *Multi-Channel Constant Current ($MC^3$) LLC Resonant LED Driver Design, Center for Power Electronics Systems*; The Bradley Department of Electrical and Computer Engineering; Virginia Polytechnic Institute and State University, CPES Conference 2011, Blacksburg, VA (Apr. 3-5, 2011), pp. 1-6.
International Search Report Corresponding to International Application No. PCT/US2011/064564; Date of Mailing: May 7, 2012; 9 Pages.
International Preliminary Report on Patentability Corresponding to International Application No. PCT/US2011/064564; Date of Mailing: Jun. 27, 2013; 6 Pages.

* cited by examiner

*Primary Examiner* — Lincoln Donovan
*Assistant Examiner* — Brandon S Cole
(74) *Attorney, Agent, or Firm* — Myers Bigel Sibley & Sajovec, P.A.

(57) ABSTRACT

A resonant tank circuit has an output port configured to be coupled to a load comprising a current-controlled semiconductor device, such as a diode, thyristor, transistor or the like. A voltage generator circuit is configured to intermittently apply voltages to an input port of the resonant tank circuit in successive intervals having a duration equal to or greater than a resonant period of the resonant tank circuit. Such an arrangement may be used, for example, to drive a static switch.

20 Claims, 9 Drawing Sheets

RESONANT TANK DRIVE CIRCUITS FOR CURRENT-CONTROLLED SEMICONDUCTOR DEVICES

BACKGROUND

The inventive subject matter relates to drive circuits and methods for semiconductor devices and, more particularly, to circuits and methods for driving current-controlled semiconductor devices.

Current-controlled semiconductor devices typically include a PN junction as a controlling terminal. Examples of such devices include thyristor-type devices such as silicon-controlled rectifier (SCRs), TRIACs and gate turn-on devices (GTOs), as well as diodes, bipolar junction transistors (BJTs) and junction field-effect transistors (JFETs).

Conventionally, such devices may be driven by simple linear circuits, such as a voltage source in series with a resistor. They also may be driven by a linear regulator that regulates a voltage over a known sense resistor. FIG. 1 illustrates a conventional technique for driving an SCR 10, in which a driver circuit 20 drives a control terminal of the SCR 10 via a resistor R.

SUMMARY OF THE INVENTIVE SUBJECT MATTER

Some embodiments of the inventive subject matter provide an apparatus including a resonant tank circuit having an output port configured to be coupled to a load including a current-controlled semiconductor device, such as a diode, thyristor, transistor or the like. The apparatus further includes a voltage generator circuit configured to alternatively apply first and second voltages to an input port of the resonant tank circuit in successive first and second time intervals having a duration equal to or greater than a resonant period of the resonant tank circuit.

The voltage generator circuit may be configured to selectively couple first and second terminals of a voltage source to the resonant tank circuit such that, for a given one of the first and second time intervals, energy transferred to the resonant tank circuit from the voltage source but not transferred to the load during the given one of the first and second time intervals is returned to the voltage source. For example, the duration of the intervals may be substantially equal to the resonant period of the resonant tank circuit. The voltage generator circuit may include, for example, an active bridge circuit configured to selectively couple the input port of the resonant tank circuit to first and second terminals of a voltage source.

In some embodiments, the resonant tank circuit may include a series resonant tank circuit. The series resonant tank circuit may include a transformer having a first winding coupled to the voltage generator circuit and a second winding coupled to the rectifier circuit. The series resonant tank circuit may further include at least one capacitor coupled in series with at least one of the first and second windings of the transformer. The series resonant tank circuit may also include at least one inductor coupled in series with at least one of the first and second windings of the transformer.

The apparatus may further include a rectifier circuit coupled to an output port of the resonant tank circuit and configured to be coupled to the load. In some embodiments, the rectifier circuit may include a first rectifier circuit having an input port coupled to a first output port of the resonant tank circuit and an output port configured to be coupled to a first current-controlled device and a second rectifier circuit having an input port coupled to a second output port of the resonant tank circuit and an output port configured to be coupled to a second current-controlled device. The resonant tank circuit may include a first transformer having a first winding coupled to the voltage generator circuit and a second winding coupled to the first rectifier circuit and a second transformer having a first winding coupled in series with the first winding of the first transformer and a second winding coupled to the second rectifier circuit.

Further embodiments provide an apparatus including a current-controlled semiconductor switch, a rectifier circuit having an output port coupled to a control terminal of the semiconductor switch and a resonant tank circuit including a transformer having a first winding coupled to an input port of the rectifier circuit. The apparatus further includes a switching circuit configured to intermittently couple a terminal of a voltage source to the resonant tank circuit for intervals having a duration substantially equal to a resonant period of the resonant tank circuit. The semiconductor switch may include, for example, a thyristor, a diode or a transistor. In some embodiments, the semiconductor switch may include a static switch.

Some embodiments provide methods of controlling a current-controlled semiconductor device. The methods include intermittently applying a voltage to an input port of a resonant tank circuit having an output port coupled to the current-controlled semiconductor device for intervals having a duration equal to or greater than a resonant period of the resonant tank circuit. Intermittently applying a voltage to an input port of a resonant tank circuit having an output port coupled to the current-controlled semiconductor device for intervals having a duration equal to or greater than a resonant period of the resonant tank circuit may include alternatively applying first and second voltages to the input port of the resonant tank circuit in successive first and second time intervals. Intermittently applying a voltage to an input port of a resonant tank circuit having an output port coupled to the current-controlled semiconductor device for intervals having a duration equal to or greater than a resonant period of the resonant tank circuit may include selectively coupling first and second terminals of a voltage source to the resonant tank circuit such that, for a given one of the first and second time intervals, energy transferred to the resonant tank circuit from the voltage source but not transferred to the load during the given one of the first and second time intervals is returned to the voltage source. For example, the intervals may have a duration substantially equal to the resonant period of the resonant tank circuit.

DETAILED DESCRIPTION OF EXEMPLARY EMBODIMENTS

Figure 1:
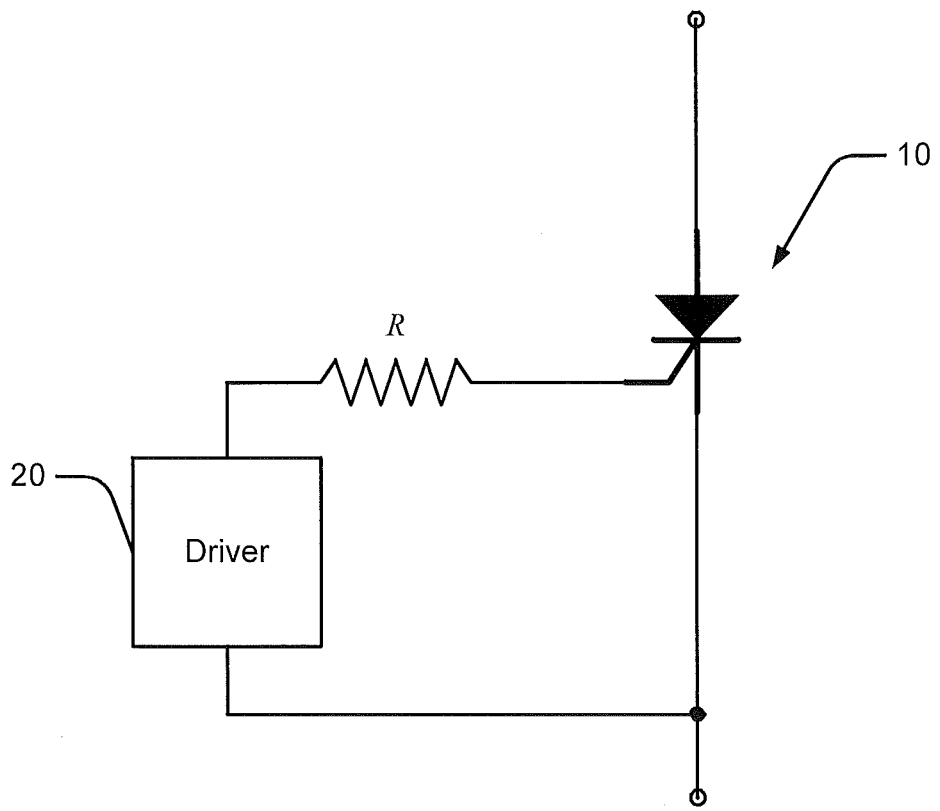
FIG. 1 is a schematic diagram illustrating a conventional drive technique for an SCR.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Embodiments of the inventive subject matter are described below with reference to block diagrams and/or operational illustrations of systems and methods according to various embodiments of the inventive subject matter. It will be understood that each block of the block diagrams and/or operational illustrations, and combinations of blocks in the block diagrams and/or operational illustrations, can be implemented by analog and/or digital hardware, and/or computer program instructions. These computer program instructions may be provided to a processor of a general purpose computer, special purpose computer, ASIC, and/or other programmable data processing apparatus, such that the instructions, which execute via the processor of the computer and/or other programmable data processing apparatus, create means for implementing the functions/acts specified in the block diagrams and/or operational illustrations. In some implementations, the functions/acts noted in the figures may occur out of the order noted in the block diagrams and/or operational illustrations. For example, two operations shown as occurring in succession may, in fact, be executed substantially concurrently or the operations may sometimes be executed in the reverse order, depending upon the functionality/acts involved.

Figure 2:
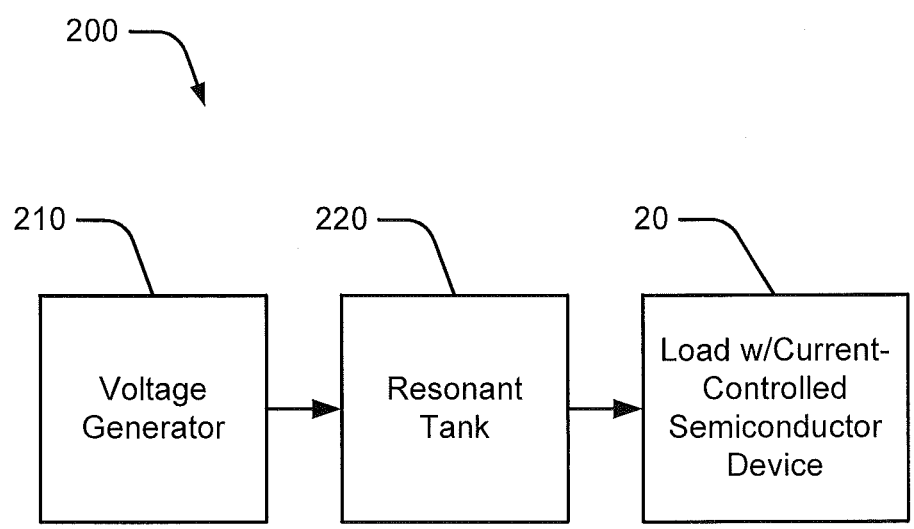
FIG. 2 is a schematic diagram illustrating an apparatus according to some embodiments of the inventive subject matter.

FIG. 2 generally illustrates components of an apparatus 200 according to some embodiments of the inventive subject matter. The apparatus 200 includes a voltage generator circuit 210 configured to intermittently apply a voltage to an input port of a resonant tank circuit 220 in successive time intervals. The resonant tank circuit 220 is configured to be coupled to a load 20 including a current-controlled semiconductor device, such as a thyristor, diode or BJT. In some embodiments explained below, the apparatus 200 may be advantageously used by controlling the time intervals during which the voltage generator circuit 210 applies a voltage to the resonant tank circuit 220 such that, for a given one of the intervals, energy transferred to the resonant tank circuit 220 is recirculated to, for example, a power supply or other voltage source.

Figure 3:
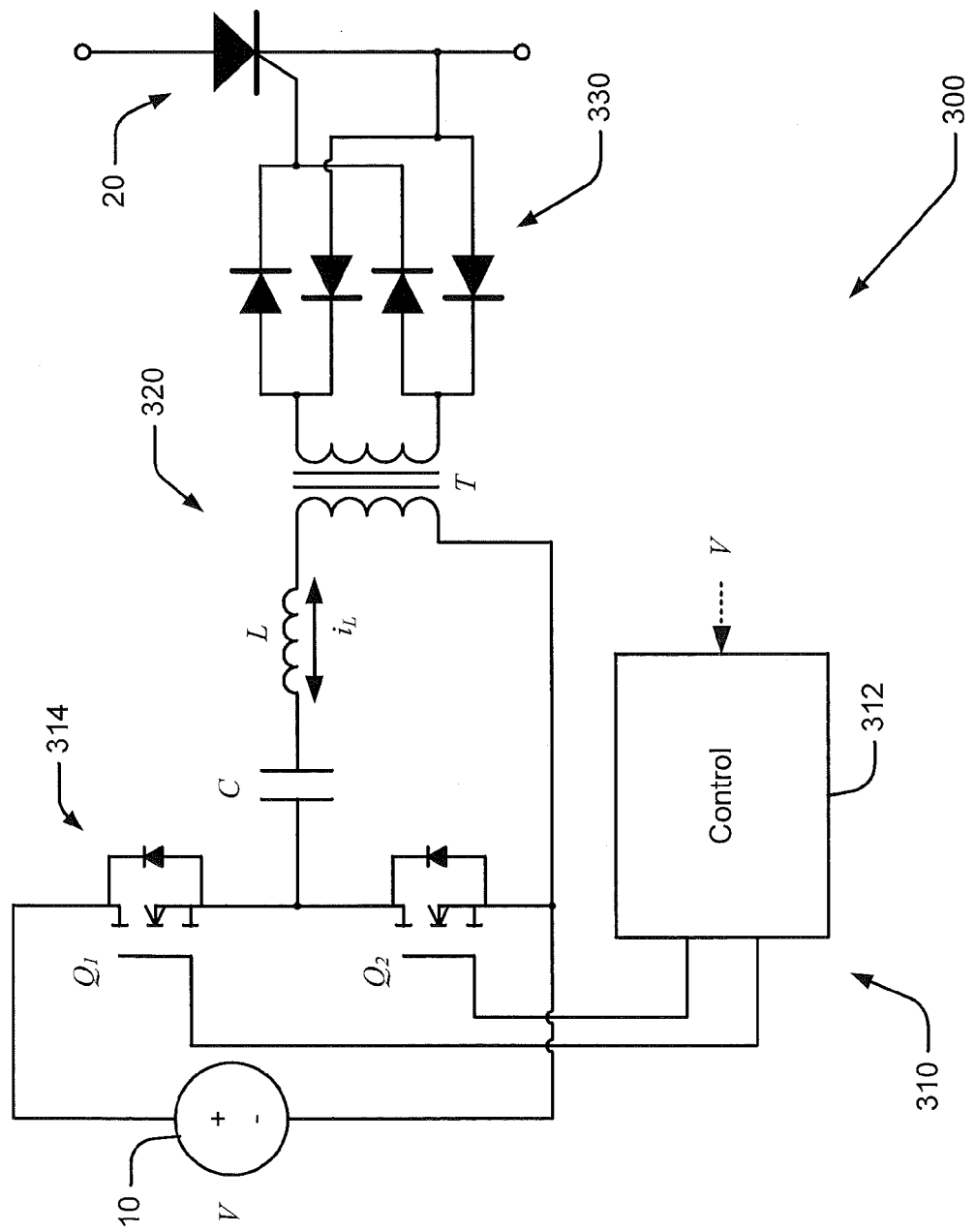
FIG. 3 is a schematic diagram illustrating an apparatus for driving a current-controlled semiconductor device according to some embodiments of the inventive subject matter.

An example of such a circuit according to further embodiments is illustrated in FIG. 3. An apparatus 300 includes a voltage generator circuit 310 including a half-bridge switching circuit 314 including transistors $Q_1$, $Q_2$ and configured to be coupled to a voltage source 10. The transistors $Q_1$, $Q_2$ are controlled by a control circuit 312. A series resonant tank circuit 320 is coupled to the half-bridge circuit 314. The series resonant tank circuit 320 includes an inductor L and a capacitor C coupled in series with a first winding of a transformer T. A second winding of the transformer T is coupled to an input port of a rectifier circuit 330, here shown as a full-wave rectifier. An output port of the rectifier circuit 330 is coupled to a control terminal of an SCR 20.

Figure 4:
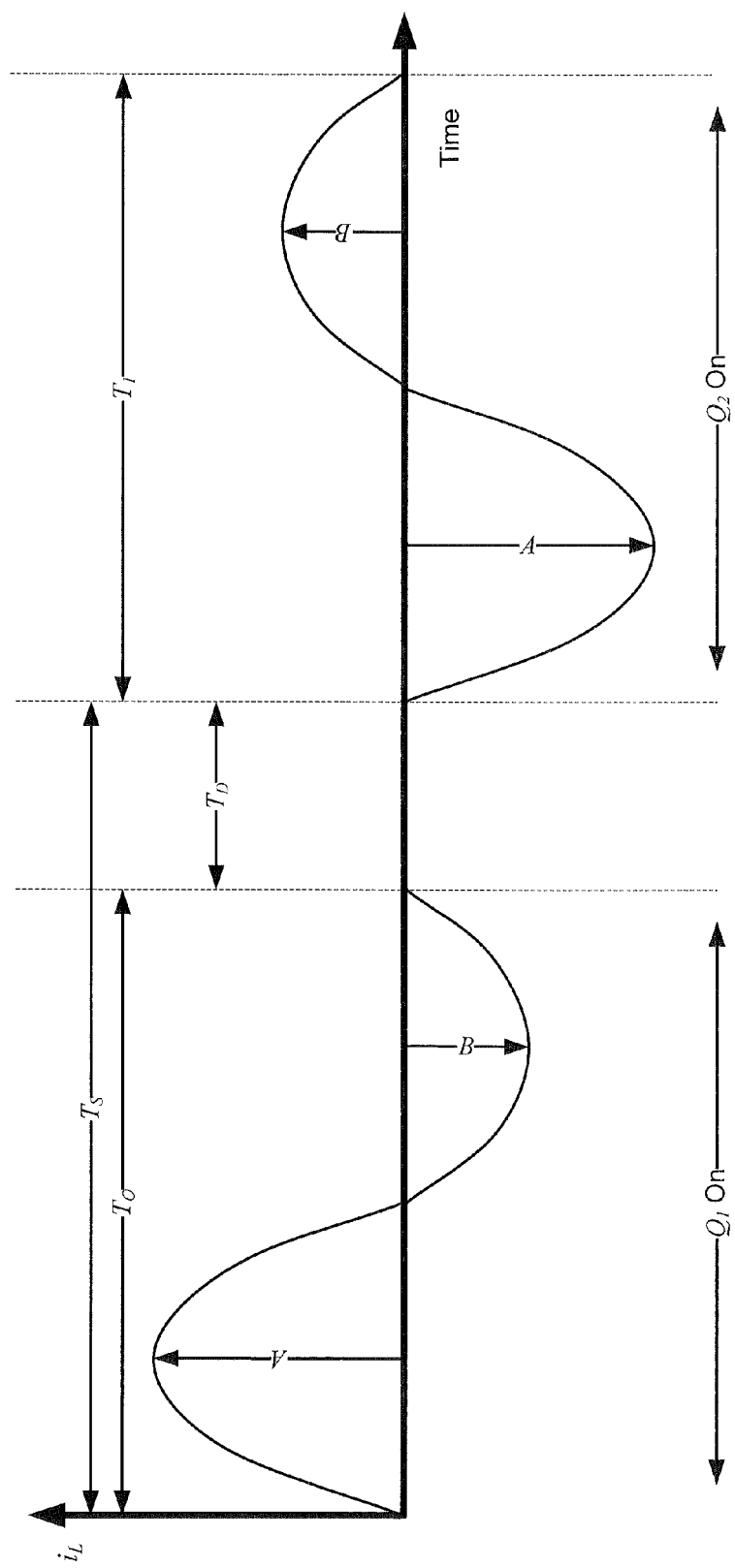
FIG. 4 is a graph illustrating drive operations and current waveform for the apparatus of FIG. 3.

FIG. 4 illustrates exemplary operations of the apparatus 300 of FIG. 3 according to some embodiments of the inventive subject matter. The control circuit 312 may operate the transistors $Q_1$, $Q_2$ such that alternate terminals of the voltage source 10 are coupled to the input of the resonant tank circuit 320 in successive time intervals $T_0$, $T_1$ separated by a dead time $T_d$. As shown, the duration of the time intervals $T_0$, $T_1$ is such that, during a given interval, energy is initially transferred from the voltage source 10 to the resonant tank circuit 320, with a portion passing on through the transformer T to the rectifier circuit 330 and on to the SCR 20. Before the end of the interval, however, energy remaining in the series resonant tank circuit 320 is transferred back to the voltage source 10.

The amount of energy transferred through the rectifier circuit 330 is dependent upon the voltage across the terminals of the SCR 20. In order to turn on an SCR, a drive circuit may initially have to apply a relatively large voltage to the SCR gate terminal to provide sufficient current to turn the SCR on, as the voltage at the gate terminal of the SCR may momentarily spike high due to a delay in establishing current flow through the SCR. A drive circuit along the lines of the apparatus 300 of FIGS. 3 and 4 can provide a drive current that is substantially independent of the gate voltage of the SCR 20, without requiring, for example, feedback control using a sense resistor connected in series with the gate terminal of the SCR 20. As the SCR 20 turns on, the relative amplitudes of the current input phase A and the current return phase B of the intervals will adjust such that less energy is transferred to the SCR 20. The apparatus 300 will not attempt to drive the voltage at the output of the rectifier circuit 330 to undesirably high levels if the gate terminal of the SCR 20 were to be disconnected.

Based on reasonable approximations, the average current $i_g$ driven though the SCR 20 by the circuit shown in FIG. 3 may be given by:

$$|i_g| = \frac{2V}{NT_s L \omega_0^2}\left(1 + e^{\frac{-\alpha\pi}{\omega_d}}\right), \quad (1)$$

where V is the voltage of the voltage source 10, N is the turns ratio of the transformer T, $T_s$ is the time between the beginnings of successive time intervals, $\omega_0$ is the resonant frequency of the series combination of the inductor L and the capacitor C, $\omega_d$ is a damped resonant frequency due to parasitic resistance (which may be approximately equal to $\omega_0$), and $\alpha$ is half the parasitic resistance over the series inductance. Thus, according to expression (1), the average current $i_g$ is substantially independent of the voltage at the gate terminal of the SCR 20.

To provide efficient operation, the duration of the intervals $T_0$, $T_1$ may be set such that the series resonant tank circuit 320 can fully cycle and return energy that is not transferred on to the load (e.g., the rectifier circuit 330 and the SCR 20) back to the voltage source 10. Such efficiency may be achieved by making the intervals $T_0$, $T_1$ have the substantially the same duration as the resonant period of the series resonant tank circuit 320. The time $T_s$ between the starts of the successive periods $T_0$, $T_1$ can be set based on the voltage V of the voltage source 10. In some embodiments, the control circuit 312 may adjust the time $T_s$ responsive to variations in the voltage V to maintain a desired gate terminal current. This approach may be advantageous, for example, in applications in which the voltage source 10 is not well-regulated.

Figure 5:
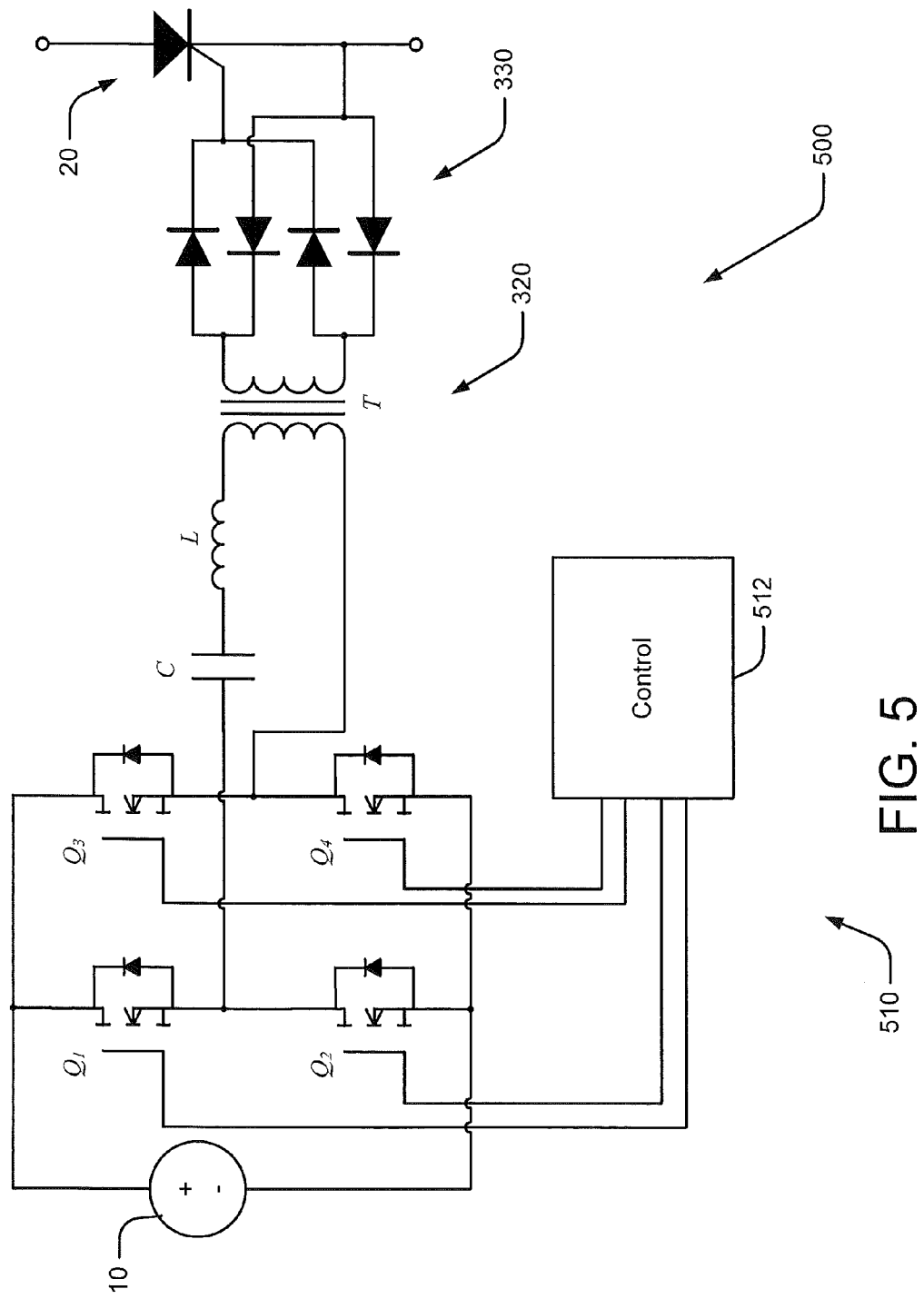
FIG. 5 is a schematic diagram illustrating an apparatus for driving a current-controlled semiconductor device according to further embodiments of the inventive subject matter.

FIG. 5 illustrates an apparatus 500 representing a modification of the apparatus 300 of FIG. 3, with the half-bridge switching circuit 310 replaced by a full-bridge switching circuit 510 including transistors $Q_1$, $Q_2$, $Q_3$, $Q_4$. It will be understood that other modifications of the circuitry shown in FIG. 3 also fall within the scope of the inventive subject matter. A series resonant circuit having a different topology may be used in place of the arrangement shown in FIG. 3. For example, the inductor L and/or the capacitor C may be moved to the secondary side of the transformer T. In other embodiments, instead of a separate inductor L, the inductance provided by the inductor L may be provided by the transformer T (e.g., by using a transformer with a relatively high leakage inductance). It will be further appreciated that other types of resonant tank circuits may also be used.

Figure 6:
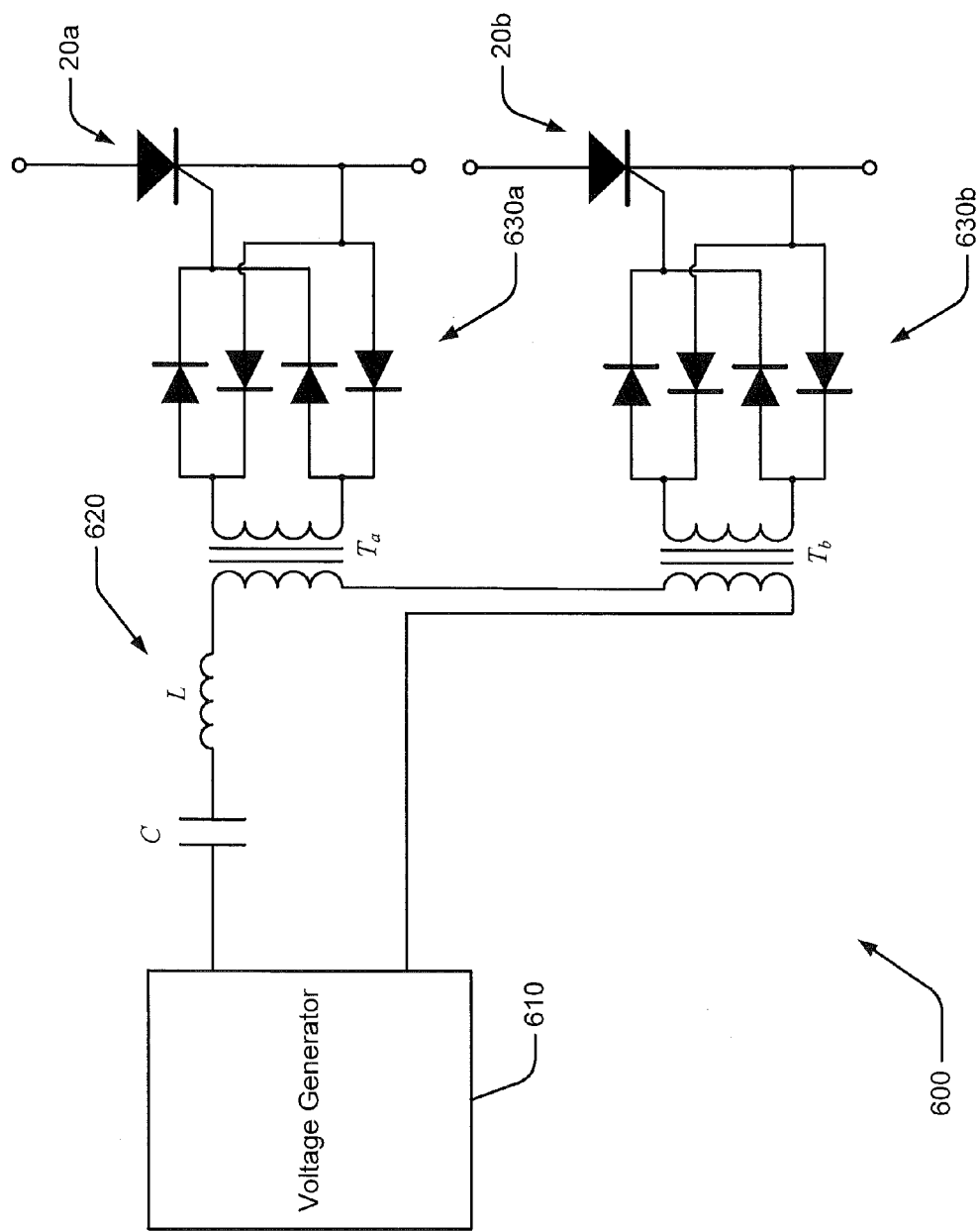
FIG. 6 is a schematic diagram illustrating an apparatus for serial driving of current-controlled semiconductor devices according to some embodiments of the inventive subject matter.

According to further embodiments, resonant drive circuits along the lines discussed above may be used to drive multiple semiconductor devices using a single resonant tank circuit. For example, FIG. 6 illustrates an apparatus including a voltage generator circuit 610, which may have, for example, a half- or full bridge configuration along the lines discussed above with reference to FIGS. 3 and 5. The voltage generator circuit 610 is coupled to a series resonant tank circuit 620 including an inductor L, a capacitor C and two transformers $T_a$, $T_b$ having windings connected in series. The first transformer $T_a$ is coupled to a first rectifier circuit 630a that drives a first SCR 20a. The second transformer $T_b$ is coupled to second rectifier circuit 630b that drives a second SCR 20b. Such an arrangement allows the first and second SCRs 20a, 20b to be driven simultaneously from the same voltage source.

Figure 7:
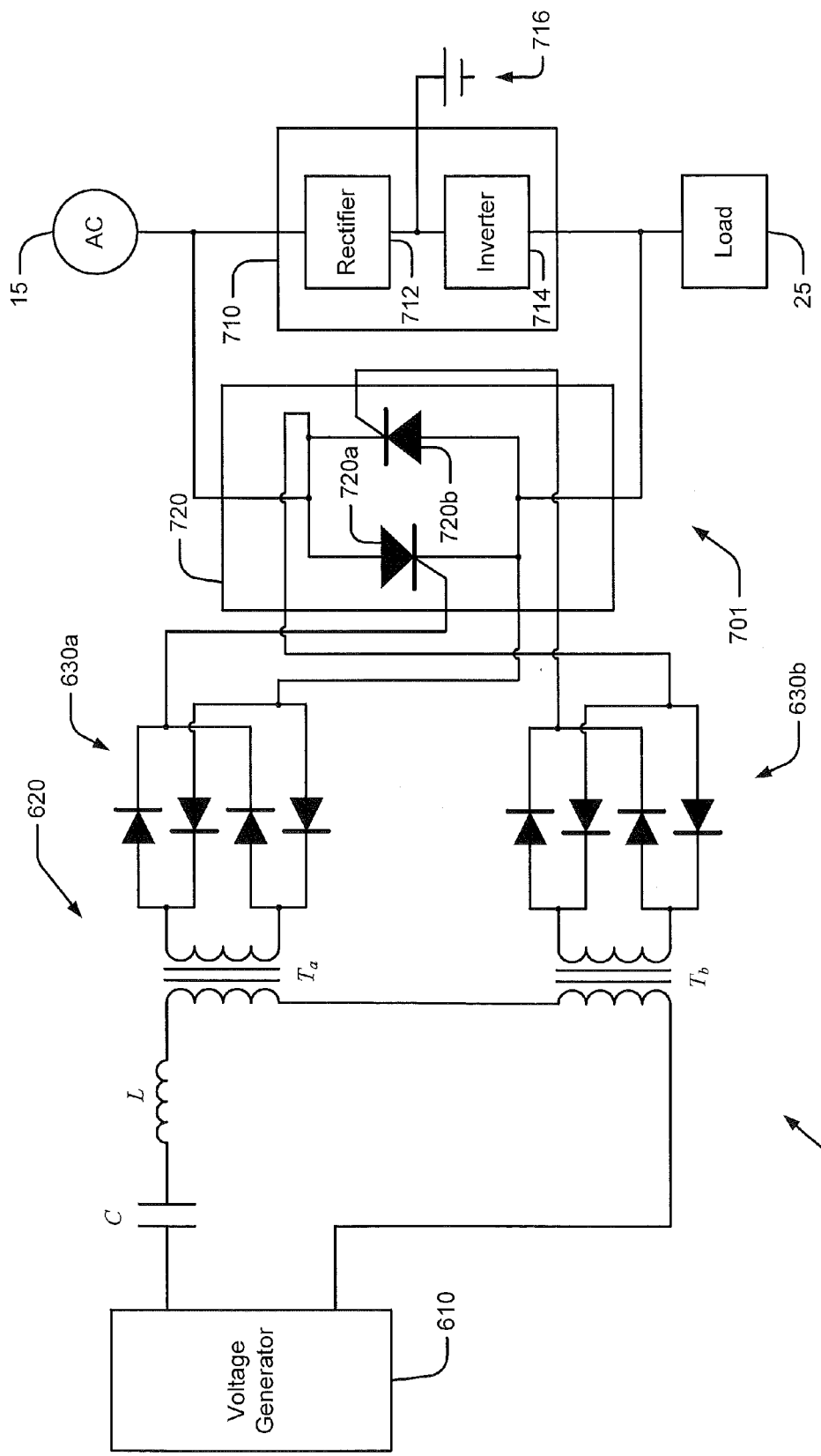
FIG. 7 is a schematic diagram illustrating use of the apparatus of claim 6 in a static switch application.

Such a circuit may be used, for example, in static switch applications, as shown in FIG. 7. An uninterruptible power supply (UPS) system 701 may include, for example, a power conversion unit 710 including a rectifier 712 coupled in series with an inverter 714. The power conversion unit 720 may support provision of power to a load 25 from a battery 716 in the event of a failure of an AC power source 15. A static switch 720 may be used, for example, to provide a controllable bypass path around the power conversion unit 710. A series-connected drive apparatus 600 as described above with reference to FIG. 6 may be used to drive respective SCRs 720a, 720b in the static switch 720. A configuration along the lines of FIG. 6 may also be useful in LED lighting applications, where the SCRs 20a, 20b might be replaced with LEDs. If an LED fails short, which is a common failure mode, the average drive current will be substantially unaffected, allowing the other devices to continue operation.

Figure 8:
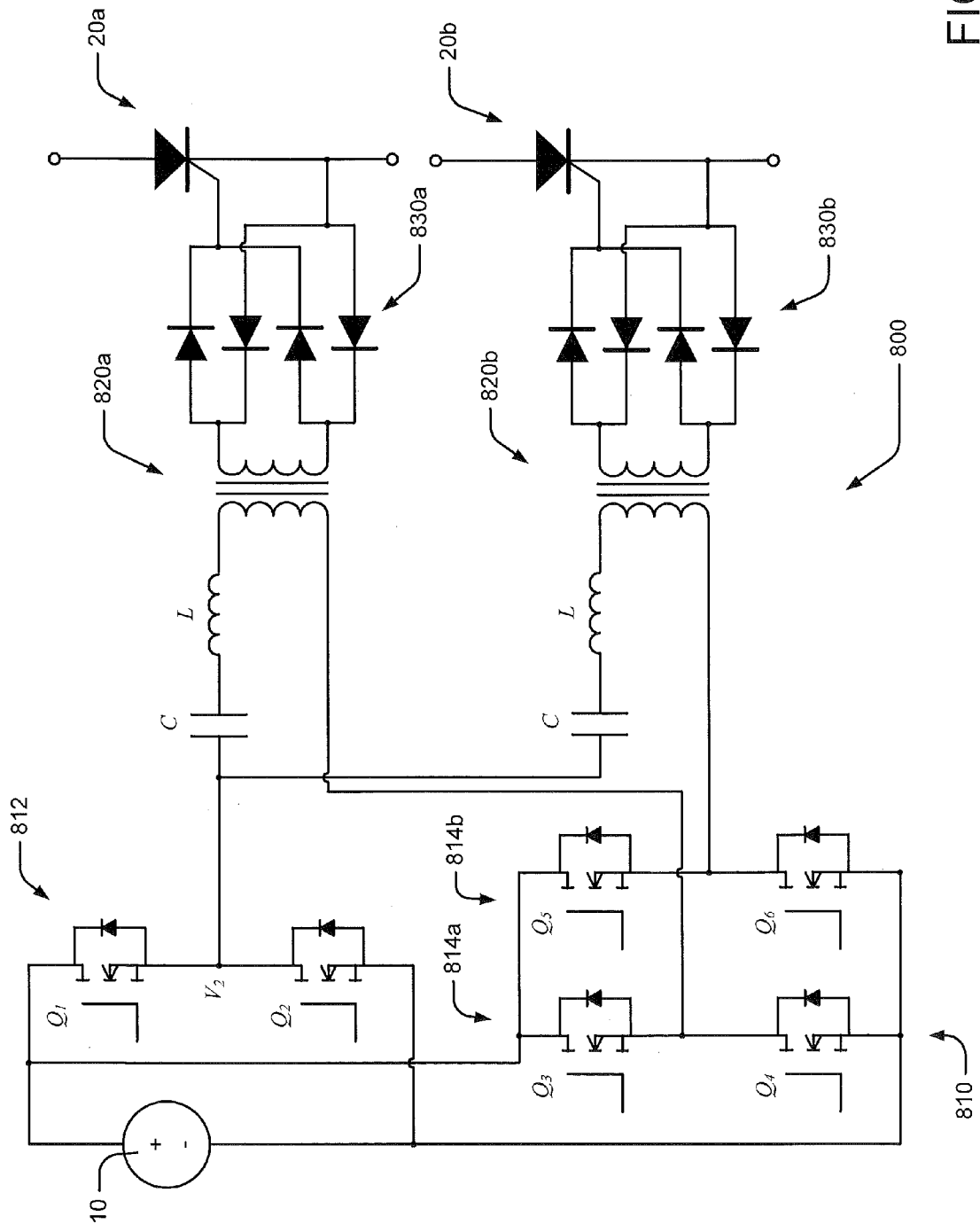
FIG. 8 is a schematic diagram illustrating an apparatus for parallel driving of current-controlled semiconductor devices according to some embodiments of the inventive subject matter.

In further embodiments, parallel implementations may be used. For example, FIG. 8 illustrates an apparatus including a voltage generator circuit 810 coupled to first and second resonant tank circuits 820a, 820b and rectifier circuits 830a, 830b that drive respective SCRs 20a, 20b. The voltage generator circuit 810 includes a shared half-bridge circuit 812 coupled to both of the first and second resonant tank circuits 820a, 820b and configured to selectively couple the first and second resonant tank circuits 820a, 820b to first and second terminals of a voltage source 10. The voltage generator circuit 810 further includes individual half-bridge circuits 814a, 814b coupled to respective ones of the first and second resonant tank circuits 820a, 820b. The individual half-bridge circuits 814a, 814b may be operated to provide independent control of the first and second SCRs 20a, 20b. Such an arrangement may be advantageously used, for example, to drive bridge switches used to control respective phases of a multiphase power converter.

Figure 9:
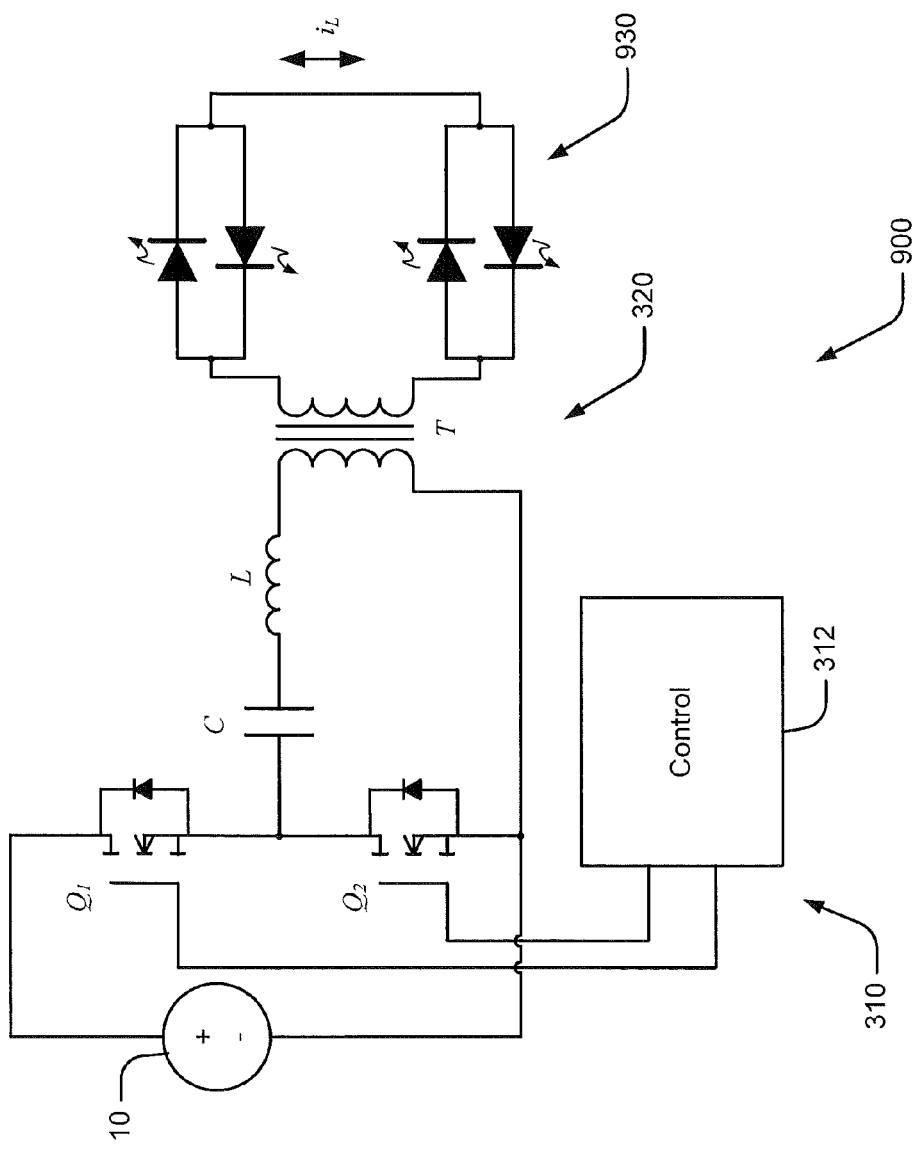
FIG. 9 is a schematic diagram illustrating an apparatus for driving anti-parallel connected semiconductor devices according to some embodiments of the inventive subject matter.

According to further embodiments, a drive circuit along the lines discussed above may be used to drive bidirectional loads. For example, FIG. 9 illustrates an apparatus 900 for driving a load 930 including one or more antiparallel-connected diodes, such as LEDs. The apparatus 900 represents a modification of the apparatus 300 of FIG. 3, with like components indicated by like reference numerals. However, in the apparatus 900, the rectifier 330 of FIG. 3 is replaced by the load 930. The apparatus 900 may operate along lines similar to those discussed above with reference to FIGS. 3 and 4 to provide a desired current $i_L$ through the load 930 to provide, for example, a desired level of illumination.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:
1. An apparatus comprising:
    a resonant tank circuit having an output port configured to be coupled to a load comprising a current-controlled semiconductor device; and
    a voltage generator circuit configured to alternately apply first and second voltages to an input port of the resonant tank circuit in successive first and second time intervals having a duration equal to or greater than a resonant period of the resonant tank circuit.
2. The apparatus of claim 1, wherein the voltage generator circuit is configured to selectively couple first and second terminals of a voltage source to the resonant tank circuit such that, for a given one of the first and second time intervals, energy transferred to the resonant tank circuit from the voltage source but not transferred to the load during the given one of the first and second time intervals is returned to the voltage source.

3. The apparatus of claim 2, wherein the energy returned is dependent upon a voltage across the current-controlled device.

4. The apparatus of claim 1, wherein the resonant tank circuit comprises a series resonant tank circuit.

5. The apparatus of claim 4, further comprising a rectifier circuit configured to be coupled to a load and wherein the series resonant tank circuit comprises a transformer having a first winding coupled to the voltage generator circuit and a second winding coupled to the rectifier circuit.

6. The apparatus of claim 5, wherein the series resonant tank circuit comprises at least one capacitor and/or at least one inductor coupled in series with at least one of the first and second windings of the transformer.

7. The apparatus of claim 1, wherein the voltage generator circuit comprises an active bridge circuit configured to selectively couple the input port of the resonant tank circuit to first and second terminals of a voltage source.

8. The apparatus of claim 1, further comprising a rectifier circuit coupled to an output port of the resonant tank circuit and configured to be coupled to the load.

9. The apparatus of claim 8:
wherein the rectifier circuit comprises:
a first rectifier circuit having an input port coupled to a first output port of the resonant tank circuit and an output port configured to be coupled to a first current-controlled device; and
a second rectifier circuit having an input port coupled to a second output port of the resonant tank circuit and an output port configured to be coupled to a second current-controlled device; and
wherein the resonant tank circuit comprises:
a first transformer having a first winding coupled to the voltage generator circuit and a second winding coupled to the first rectifier circuit; and
a second transformer having a first winding coupled in series with the first winding of the first transformer and a second winding coupled to the second rectifier circuit.

10. The apparatus of claim 8, further comprising a current-controlled semiconductor device coupled to an output port of the rectifier.

11. The apparatus of claim 10, wherein the current-controlled semiconductor device comprises a thyristor, a diode or a transistor.

12. The apparatus of claim 10, wherein the current-controlled semiconductor device comprises a static switch.

13. The apparatus of claim 1, wherein the load comprises at least one pair of anti-parallel connected diodes coupled across an output of the resonant tank circuit.

14. An apparatus comprising:
a semiconductor switch;
a rectifier circuit having an output port coupled to a control terminal of the semiconductor switch;
a resonant tank circuit comprising a transformer having a first winding coupled to an input port of the rectifier circuit; and
a switching circuit configured to intermittently couple a terminal of a voltage source to the resonant tank circuit for intervals having a duration substantially equal to a resonant period of the resonant tank circuit.

15. The apparatus of claim 14, wherein the semiconductor switch comprises a thyristor, a diode or a transistor.

16. The apparatus of claim 14, wherein the semiconductor switch comprises a static switch.

17. A method of controlling a current-controlled semiconductor device, the method comprising:
intermittently applying a voltage to an input port of a resonant tank circuit having an output port coupled to the current-controlled semiconductor device for intervals having a duration equal to or greater than a resonant period of the resonant tank circuit.

18. The method of claim 17, wherein intermittently applying a voltage to an input port of a resonant tank circuit having an output port coupled to the current-controlled semiconductor device for intervals having a duration equal to or greater than a resonant period of the resonant tank circuit comprises alternately applying first and second voltages to the input port of the resonant tank circuit in successive first and second time intervals.

19. The method of claim 18, wherein intermittently applying a voltage to an input port of a resonant tank circuit having an output port coupled to the current-controlled semiconductor device for intervals having a duration equal to or greater than a resonant period of the resonant tank circuit comprises selectively coupling first and second terminals of a voltage source to the resonant tank circuit such that, for a given one of the first and second time intervals, energy transferred to the resonant tank circuit from the voltage source but not transferred to the load during the given one of the first and second time intervals is returned to the voltage source.

20. The method of claim 17, wherein the intervals have a duration substantially equal to the resonant period of the resonant tank circuit.

* * * * *